United States Patent
Bogner et al.

(10) Patent No.: US 8,916,900 B2
(45) Date of Patent: Dec. 23, 2014

(54) OPTOELECTRONIC MODULE AND METHOD OF PRODUCING AN OPTOELECTRONIC MODULE

(75) Inventors: Georg Bogner, Lappersdorf (DE); Stefan Gruber, Bad Abbach (DE)

(73) Assignee: OSRAM Opto Semiconductors GmbH (DE)

( * ) Notice: Subject to any disclaimer, the term of this patent is extended or adjusted under 35 U.S.C. 154(b) by 150 days.

(21) Appl. No.: 13/318,504

(22) PCT Filed: Apr. 28, 2010

(86) PCT No.: PCT/DE2010/000492
§ 371 (c)(1),
(2), (4) Date: Nov. 10, 2011

(87) PCT Pub. No.: WO2010/136006
PCT Pub. Date: Dec. 2, 2010

(65) Prior Publication Data
US 2012/0056235 A1    Mar. 8, 2012

(30) Foreign Application Priority Data
May 27, 2009   (DE) .......................... 10 2009 022 901

(51) Int. Cl.
*H01L 33/26* (2010.01)
*H05K 1/18* (2006.01)
*H01L 25/16* (2006.01)

(52) U.S. Cl.
CPC .............. *H05K 1/183* (2013.01); *H01L 25/167* (2013.01); *H05K 1/181* (2013.01); *H05K 2201/10106* (2013.01); *H05K 2201/10515* (2013.01); *H05K 2201/10674* (2013.01); *H05K 2201/10977* (2013.01); *H05K 2203/049* (2013.01); *H01L 2224/48091* (2013.01); *H01L 2224/48227* (2013.01)
USPC .............. 257/99; 257/E33.056; 257/E33.066; 438/26

(58) Field of Classification Search
CPC ........... H01L 2924/00014; H01L 2224/48227; H01L 25/167
USPC .............................................. 257/99, E33.072
See application file for complete search history.

(56) References Cited

U.S. PATENT DOCUMENTS

| 7,501,660 B2 | 3/2009 | Schmid et al. |
| 2002/0105091 A1 | 8/2002 | Ishii et al. |

(Continued)

FOREIGN PATENT DOCUMENTS

| DE | 10 2004 031 391 A1 | 1/2006 |
| DE | 10 2007 020 475 A1 | 11/2008 |

(Continued)

OTHER PUBLICATIONS

A German translation of the Chinese Examination Report issued Nov. 27, 2013 for Chinese Application No. 2010800230253.

(Continued)

*Primary Examiner* — Stephen W Smoot
*Assistant Examiner* — Edward Chin
(74) *Attorney, Agent, or Firm* — DLA Piper LLP (US)

(57) ABSTRACT

An optoelectronic module includes a radiation-emitting semiconductor component, an electrical component and a carrier substrate. The carrier substrate includes a top and a bottom, wherein first electrical connections are arranged on the bottom and second electrical connections are arranged on the top. The electrical component is arranged on the top of the carrier substrate and is electrically conductively connected with the first electrical connections. The radiation-emitting semiconductor component is arranged on the side of the electrical component remote from the carrier substrate. The radiation-emitting semiconductor component furthermore includes conductive structures electrically conductively connected with the second electrical connections.

13 Claims, 2 Drawing Sheets

(56) References Cited

U.S. PATENT DOCUMENTS

| | | |
|---|---|---|
| 2004/0188699 A1* | 9/2004 | Kameyama et al. ............ 257/99 |
| 2006/0014429 A1* | 1/2006 | Schmid et al. ................ 439/596 |
| 2006/0220051 A1* | 10/2006 | Fung et al. ...................... 257/99 |
| 2007/0069232 A1* | 3/2007 | Kameyama et al. ............ 257/99 |
| 2007/0257901 A1* | 11/2007 | Gotou et al. ................... 345/212 |
| 2007/0295975 A1 | 12/2007 | Omae |
| 2008/0106251 A1* | 5/2008 | Cabral et al. .................. 324/114 |
| 2008/0203897 A1* | 8/2008 | De Samber et al. .......... 313/498 |
| 2009/0071710 A1* | 3/2009 | Stelzl et al. ................... 174/520 |
| 2009/0115049 A1 | 5/2009 | Shiraishi et al. |
| 2009/0173958 A1* | 7/2009 | Chakraborty et al. .......... 257/98 |
| 2009/0261365 A1 | 10/2009 | Brunner et al. |
| 2010/0059783 A1* | 3/2010 | Chandra ......................... 257/99 |

FOREIGN PATENT DOCUMENTS

| | | |
|---|---|---|
| JP | 2-281976 | 11/1990 |
| JP | 4-276649 | 10/1992 |
| JP | 2001-203427 A | 7/2001 |
| JP | 2002231885 | 8/2002 |
| JP | 2007-312107 | 11/2007 |
| JP | 2009-510741 | 3/2009 |

OTHER PUBLICATIONS

A translation of the Final Notice of Reasons for Refusal dated Jun. 23, 2014 for Japanese Application No. 2012-512198.

* cited by examiner

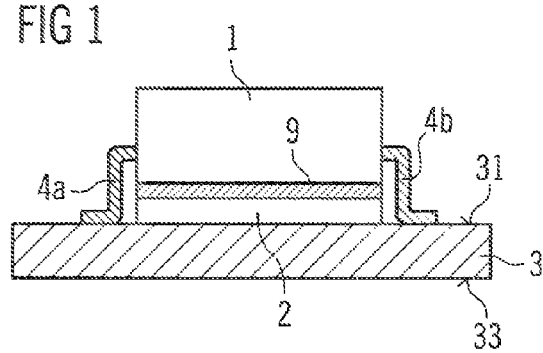
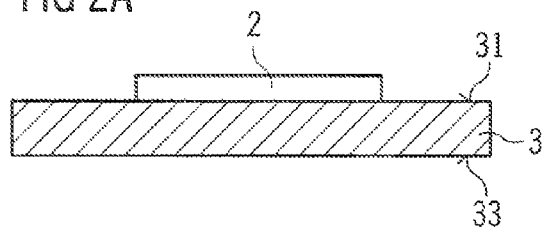
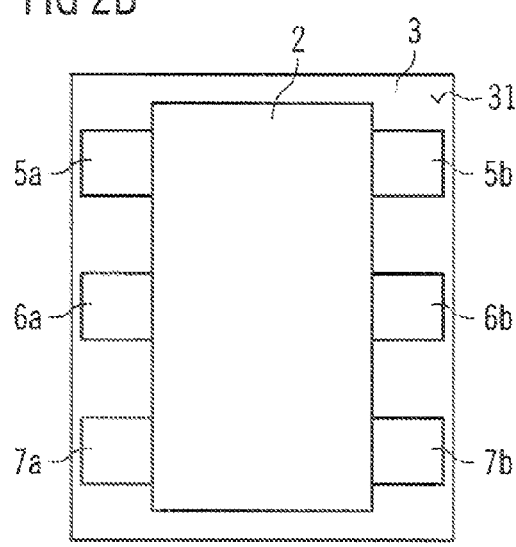
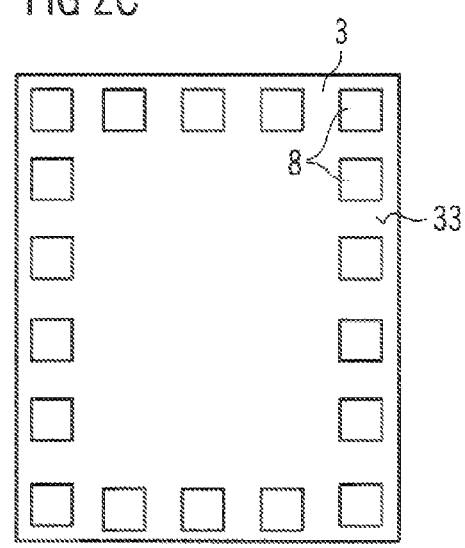

OPTOELECTRONIC MODULE AND METHOD OF PRODUCING AN OPTOELECTRONIC MODULE

RELATED APPLICATIONS

This is a §371 of International Application No. PCT/DE2010/000492, with an international filing date of Apr. 28, 2010 (WO 2010/136006, published Dec. 2, 2010), which is based on German Patent Application No. 10 2009 022 901.9, filed May 27, 2009, the subject matter of which is incorporated by reference.

TECHNICAL FIELD

This disclosure relates to an optoelectronic module having a radiation-emitting semiconductor component, an electrical component and a carrier substrate and to a method of producing such an optoelectronic module.

BACKGROUND

Modules are known which comprise a plurality of electrical and/or optical components, wherein the individual components are arranged adjacent one another, for example, on a carrier substrate. The individual electrical components may be arranged in a common housing, wherein due to the lateral arrangement of the electrical and/or optical components, the housings are of a size such that all the components may be arranged adjacent one another. Depending on the nature of the components, various techniques such as, for example, soldering or adhesive bonding may be used for mounting the individual components.

It could therefore be helpful to provide an improved optoelectronic module which is in particular distinguished by a reduced module size. It could further be helpful to provide a method of producing an optoelectronic module which is in particular distinguished by reduced manufacturing costs and complexity.

SUMMARY

We provide an optoelectronic module including a radiation-emitting semiconductor component, an electrical component and a carrier substrate including a top and a bottom, wherein first electrical connections are arranged on the bottom and second electrical connections are arranged on the top, the electrical component is arranged on the top of the carrier substrate and is electrically conductively connected with the first electrical connections, the radiation-emitting semiconductor component is arranged on the side of the electrical component remote from the carrier substrate, and the radiation-emitting semiconductor component comprises conductive structures electrically conductively connected with the second electrical connections.

We also provide a method of producing an optoelectronic module including mounting an electrical component on a top portion of a carrier substrate which comprises first electrical connections on a bottom portion and second electrical connections on the top portion, wherein the electrical component is electrically conductively connected with the first electrical connections, mounting a radiation-emitting semiconductor component such that the radiation-emitting semiconductor component is arranged on a side of the electrical component remote from the carrier substrate and conductive structures of the radiation-emitting component are electrically conductively connected with the second electrical connections.

BRIEF DESCRIPTION OF THE DRAWINGS

FIG. 1 is a schematic cross section of an example of an optoelectronic module.

FIGS. 2A to 2C each show a schematic view of an example of an optoelectronic module during the production process.

DETAILED DESCRIPTION

Figure 3:
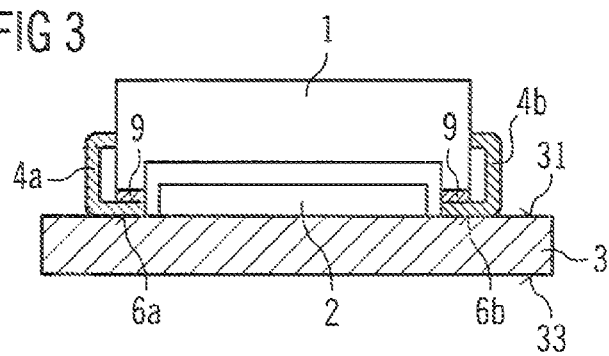
FIGS. 3 to 6 each show a schematic cross section of an example of an optoelectronic module.

We provide an optoelectronic module which comprises a radiation-emitting component, an electrical component and a carrier substrate. The carrier substrate comprises a top and a bottom, first electrical connections being arranged on the bottom and second electrical connections on the top. The electrical component is arranged on the top of the carrier substrate and connected electrically conductively with the first electrical connections. The radiation-emitting semiconductor component is arranged on the side of the electrical component remote from the carrier substrate and comprises conductive structures electrically conductively connected with the second electrical connections.

The radiation-emitting semiconductor component and the electrical component are accordingly not mounted adjacent one another on the carrier substrate. In particular, the radiation-emitting semiconductor component and the electrical component are arranged relative to one another such that the electrical component is located beneath the radiation-emitting semiconductor component. In particular, the electrical component is arranged between the radiation-emitting semiconductor component and the carrier substrate. The electrical component and the radiation-emitting semiconductor component are thus stacked on one another and form a "stack".

As a consequence, module size may advantageously be reduced. In particular, the lateral extent of the module is reduced. The lateral extent should in particular be taken to mean the base area of the module.

The radiation-emitting semiconductor component is preferably arranged in a centered manner relative to the electrical component. The electrical component and the radiation-emitting semiconductor component preferably each comprise a vertical center axis preferably arranged directly on one another. The electrical component and the radiation-emitting semiconductor component particularly preferably comprise a common vertical center axis.

The size of the module, in particular the base area of the module, is not dependent on the number of electrical and/or radiation-emitting components since the latter are stacked on one another.

The size of the module is preferably arranged such that, outside a mounting area of the electrical component, there are free areas located on the top of the carrier substrate, which free areas are for example provided with solder contacts. These contacts serve for example as second electrical connections for the radiation-emitting semiconductor component and/or as further electrical connections for further electrical components.

The top of the carrier substrate preferably comprises at least two second connections, preferably six second connections, and the bottom comprises at least twelve first connections, for example eighteen first connections.

The number of components in such a stack is not restricted to two. A plurality of radiation-emitting semiconductor components may, for example, be arranged on one another on the electrical component. In this case, in each case one radiation-emitting semiconductor component is located in a centered manner on a further radiation-emitting semiconductor component, wherein the stack of radiation-emitting semiconductor components is in turn arranged in a centered manner on the electrical component. The electrical component is mounted on the carrier substrate.

Preferably, the carrier substrate is a printed circuit board, the radiation-emitting semiconductor component an LED and the electrical component an IC for driving the LED.

The IC (Integrated Circuit) may comprise active or passive components such as, for example, resistors or capacitors. The active and/or passive components are in particular suitable for driving the LED.

The radiation-emitting component preferably comprises a mounting side with which the radiation-emitting component is arranged on the electrical component. The radiation-emitting component furthermore preferably comprises a radiation exit side which is on the opposite side to the mounting side, from which exit side the radiation emitted by the radiation-emitting semiconductor component preferably leaves the module.

The carrier substrate may furthermore be a housing in which the stack comprising the radiation-emitting semiconductor component and the electrical component are arranged.

The conductive structures are preferably electrically conductive webs which project out from the radiation-emitting semiconductor component.

The electrically conductive webs preferably in each case project out from a side face of the radiation-emitting semiconductor component. The electrically conductive webs are particularly preferably shaped such that they are curved away from the radiation-emitting semiconductor component towards the carrier substrate.

The webs are in particular preferably guided out from the radiation-emitting semiconductor component such that they are in zones guided parallel to the top of the carrier substrate. The electrically conductive webs preferably comprise a curvature such that the electrically conductive webs are bent towards the carrier substrate. The radiation-emitting semiconductor components are electrically conductively connected by the curved webs to the second electrical connections on the carrier substrate.

Preferably, the electrically conductive webs are of L-shaped construction. In particular, the electrically conductive webs are shaped as an upside down L and arranged on the carrier substrate. As a consequence, an electrical connection may be provided via the webs between the radiation-emitting semiconductor component, in particular between the side faces of the radiation-emitting semiconductor component, and second electrical connections of the carrier substrate.

Further preferably, the electrically conductive webs are of Z-shaped construction. As a consequence, subzones of the electrically conductive webs are for example guided on the second electrical connections of the carrier substrate away from the radiation-emitting semiconductor component.

Further preferably, the electrically conductive webs are of J-shaped construction. In this case too, subzones of the electrically conductive webs are guided on the second electrical connections of the carrier substrate, the electrically conductive webs being guided towards the radiation-emitting semiconductor component.

The electrically conductive webs are preferably metal webs. In comparison with bonding wires, for example, metal webs are more robust, such that the radiation-emitting semiconductor component may be electrically contacted in robust manner.

Further preferably, the first electrical connections are guided through the carrier substrate by vias. The vias are in particular guided from the top to the bottom of the carrier substrate. The electrical component may in this manner be electrically contacted on the bottom of the carrier substrate by the vias and by the first connections. A miniaturised module size is thus advantageously made possible.

Further preferably, the module is a surface-mountable module.

Surface-mountable modules (SMD: surface mounted device) preferably comprise solderable lands on the bottom, in particular the first electrical connections, such that they may for example be soldered directly onto external fastening elements.

Further preferably, the carrier substrate comprises a cavity with a height H in which the electrical component is arranged, the height H of the cavity being greater than a height $h_1$ of the electrical component. The electrical component is enclosed in an encapsulating material such that the height $h_1$ of the electrical component plus a height $h_2$ of the encapsulating material which is located over the electrical component corresponds to the height H of the cavity. The radiation-emitting semiconductor component is preferably arranged on the encapsulating material.

In this case, the encapsulating material is arranged between the electrical component and radiation-emitting semiconductor component. The radiation-emitting semiconductor component is thus not arranged directly on the electrical element.

The encapsulating material, preferably level, fills the cavity of the carrier substrate. In particular, the encapsulating material forms a planar surface of the carrier substrate on which the radiation-emitting semiconductor component may then be mounted. The electrical element is preferably arranged completely in the cavity.

Preferably, the module additionally comprises a housing in which are arranged the carrier substrate, the electrical component and the radiation-emitting component, wherein the housing comprises radiation-absorbing particles.

Thanks to the radiation-absorbing particles in the housing, it is advantageously possible for example to reduce the action of extraneous light, for example sunlight. Incident extraneous light results in inadequate contrast due to the extraneous light reflected at the emission face of the module and the radiation exit side of the radiation-emitting component. Thanks to the radiation-absorbing particles it is advantageously possible to avoid the inadequate contrast.

Further preferably, the module additionally comprises an encapsulation which encloses the radiation-emitting component and comprises further radiation-absorbing particles. Undesired action of extraneous light, in particular any resultant inadequate contrast, may in this manner advantageously be further minimized.

Further preferably, the carrier substrate takes the form of a multilayer substrate. A multilayer substrate should in particular be taken to mean a substrate composed of at least two different layers. These layers may, for example, differ with regard to material composition. In this manner, a carrier substrate may be obtained which comprises zones which exhibit different properties depending on the nature of the application.

Further preferably, further electrical components are arranged on the top of the carrier substrate and electrically conductively connected with further first electrical connections on the bottom of the carrier substrate, further radiation-emitting components in each case being arranged on the side of an electrical component remote from the carrier substrate and being electrically conductively connected with further second electrical connections on the top of the carrier substrate.

Depending on the desired application of the module, a plurality of electrical components and a plurality of radiation-emitting semiconductor components may thus be used, the electrical components in each case being provided for driving a radiation-emitting semiconductor component. The radiation-emitting components are each arranged on an electrical component. A plurality of stacks in each case comprising at least one radiation-emitting component and an electrical component are thus arranged on the carrier substrate. Due to the stacked arrangement of the individual components, it is in particular advantageously possible to minimize the spacing of the radiation-emitting semiconductor components relative to one another. Furthermore, the plurality of electrical components and the plurality of radiation-emitting components may be arranged in space-saving manner on the carrier substrate. A miniaturized module size may advantageously be achieved.

A method of producing an optoelectronic module is furthermore provided. By the method, it is in particular possible to produce a module as is disclosed in relation to one of the above-described examples. In other words, all features disclosed in relation to the module are also disclosed for the method and vice versa.

An electrical component may be mounted on the top of a carrier substrate, the carrier substrate comprising first electrical connections on the bottom and second electrical connections on the top. The electrical component is electrically conductively connected with the first electrical connections. A radiation-emitting component is then mounted such that the radiation-emitting semiconductor component is arranged on the side of the electrical component remote from the carrier substrate. Conductive structures of the radiation-emitting component are further electrically conductively connected with the second electrical connections of the carrier substrate.

The radiation-emitting component is accordingly arranged on the electrical component, whereby a stack of components is produced. The production of such a module is in particular distinguished by an inexpensive and simplified production method. Cost-optimized production of the module may advantageously be achieved in this manner.

Further features, advantages, preferred configurations and convenient aspects of the optoelectronic module and of the production method are revealed by the examples explained below with reference to FIGS. 1 to 6.

Identical or equivalently acting components are in each case denoted with identical reference numerals. The components illustrated and the size ratios of the components to one another should not be regarded as to scale.

FIG. 1 shows a schematic cross-section of an optoelectronic module which comprises an electrical component 2, a carrier body 3 and a radiation-emitting semiconductor component 1. The carrier substrate 3 comprises first electrical connections on the bottom 33 and second electrical connections on the top 31. The electrical component 2 is arranged on the top 31 of the carrier substrate 3 and electrically conductively connected with the first electrical connections of the carrier substrate 3. The radiation-emitting semiconductor component 1 is arranged on the side of the electrical component 2 remote from the carrier substrate 3. The radiation-emitting semiconductor component 1 may be fastened to the electrical component 2 for example by a coupling layer or an adhesive layer 9. Alternatively, the radiation-emitting semiconductor component 1 may be fastened to the electrical component 2 by a soldering process.

The electrical component 2 and the radiation-emitting semiconductor component 1 are thus arranged on one another, in particular are stacked. The radiation-emitting semiconductor component 1 is preferably arranged in a centered manner on the electrical component 2. The base area of the radiation-emitting semiconductor component 1 preferably virtually corresponds to the base area of the electrical component 2 such that in plan view onto the stack, the radiation-emitting semiconductor component 1 does not project out laterally beyond the electrical component 2.

The radiation-emitting semiconductor component 1 preferably comprises a mounting side which faces the electrical component 2. The radiation exit side of the radiation-emitting component is preferably located on the opposite side to the mounting side. The radiation emitted by the radiation-emitting semiconductor component 1 preferably mainly emerges from the semiconductor component 1 on the radiation exit side.

The radiation-emitting semiconductor component 1 furthermore comprises conductive structures 4a, 4b electrically conductively connected with the second electrical connections of the carrier substrate 3. The conductive structures 4a, 4b are preferably arranged on side faces of the radiation-emitting semiconductor component 1.

In the example of FIG. 1, the conductive structures 4a, 4b are of Z-shaped construction. In particular, the conductive structures 4a, 4b lead perpendicularly out of side faces of the radiation-emitting semiconductor component 1, are then guided in zones parallel to the top 31 of the carrier substrate 1 and then bend towards the carrier substrate 3. In particular, the bend in the conductive structures 4a, 4b leads towards the carrier substrate 3 and to the carrier substrate 3. On the carrier substrate 3, the conductive structures 4a, 4b have a further bend such that the conductive structures 4a, 4b are guided on the top 31. In particular, the conductive structures 4a, 4b are in zones in direct contact with the second electrical connections. The conductive structures 4a, 4b on the top 31 of the carrier substrate 3 preferably lead away from the radiation-emitting semiconductor component 1.

The carrier substrate 3 is preferably a printed circuit board, on the bottom 33 of which first electrical connections are guided for electrically contacting the electrical component 2, and on the top 31 of which second electrical connections, for example, conductor tracks are guided for electrically contacting the radiation-emitting component 1.

The radiation-emitting semiconductor component 1 is preferably an LED or an LED chip. Alternatively, the radiation-emitting semiconductor component 1 may comprise a multilayer semiconductor structure arranged in an LED housing, which structure exhibits radiation-emitting properties, thus in particular comprises an active layer. An encapsulating material may furthermore be introduced into the LED housing such that the semiconductor layer stack is, for example, encapsulated with an epoxy resin. The radiation-emitting semiconductor component 1 may thus take the form not only of an LED chip or an LED, but in particular also of an LED package.

The LED package preferably comprises three LED chips. The three LED chips are particularly preferably RGB LEDs. This means that one of the LED chips emits red radiation, one of the LED chips emits green radiation and one of the LED chips emits blue radiation.

The electrical component 1 is preferably an IC for driving the LED, the LED chips or the LED package.

Due to the stacked arrangement of the components, in particular of the electrical component 2 and the radiation-emitting semiconductor component 1, the base area of such a module is advantageously reduced. In particular, a miniaturized module may be obtained in this manner. In particular, the base area of the module is reduced by the necessary mounting surface of the radiation-emitting semiconductor component 1, since the latter is arranged directly on the electrical component 2. An arrangement of the components adjacent one another on the carrier substrate 3 is thus advantageously avoided.

The conductive structures 4a, 4b are preferably electrically conductive webs which project out from the radiation-emitting semiconductor component 1. The electrically conductive webs 4a, 4b are particularly preferably metal webs. These are in particular advantageously distinguished by being robust and, unlike bonding wires for example, are not flexibly bendable.

The carrier substrate 3 preferably takes the form of a multilayer substrate. This means that the carrier substrate 3 comprises at least two layers arranged on one another. The carrier substrate 3 may thus be adapted in zones to specific requirements.

The module is preferably a surface-mountable module. The module of FIG. 1 may preferably be externally mounted and electrically connected on the bottom 33.

Further electrical components may be arranged on the top 31 of the carrier substrate 3 and the components may be electrically conductively connected with further first electrical connections on the bottom 33 of the carrier substrate 3 (not shown). In this case, further radiation-emitting components are preferably arranged on the further electrical components. In particular, a further radiation-emitting component is arranged in each case on a further electrical component. A plurality of stacks comprising at least one electrical component and a radiation-emitting component are accordingly arranged on the top 31 of the carrier substrate 3. The stacks may advantageously be arranged close to one another. A space-saving module with a plurality of stacks may thus advantageously be achieved.

It is furthermore also possible to stack a plurality of radiation-emitting semiconductor components on one another and to arrange them on an electrical component (not shown).

FIGS. 2A to 2C show schematic views of an optoelectronic module during production. FIG. 2A in particular shows a schematic cross-section of a module with a carrier substrate 3 and an electrical component 2 arranged thereon. FIG. 2B shows to this end a plan view of the module of FIG. 2A. FIG. 2C shows a view from below of the module from FIG. 2A.

FIG. 2A shows a carrier substrate 3 which comprises a top 31 and a bottom 33. Second electrical connections are arranged on the top 31. An electrical component 2 is furthermore arranged on the top 31. The bottom 33 of the carrier substrate 3 comprises first electrical connections.

FIG. 2B shows the top 31 of the carrier substrate 3 in plan view. The top 31 comprises second electrical connections 5a, 5b, 6a, 6b, 7a, 7b. In particular, in the example of FIG. 2B, the carrier substrate 3 comprises six second electrical connections 5a, 5b, 6a, 6b, 7a, 7b.

The second electrical connections 5a, 5b, 6a, 6b, 7a, 7b preferably serve for electrically contacting the radiation-emitting component. In FIGS. 2A to 2C, the radiation-emitting semiconductor component is not shown for clarity's sake.

The radiation-emitting component is preferably an LED package, in particular RGB LEDs. In this case, the red radiation-emitting LED chip is for example electrically conductively connected with the second connections 5a, 5b, the green radiation-emitting LED chip with the second connections 6a, 6b and the blue radiation-emitting LED chip with the second connections 7a, 7b.

The electrical component 2 is in particular an IC, preferably an enclosed IC, which is suitable for driving the radiation-emitting component, in particular the RGB LEDs.

FIG. 2C shows the bottom of the carrier substrate 3 of the example of FIG. 2B, namely the side of the carrier substrate 3 remote from the electrical component 2. The first electrical connections 8 are arranged on the bottom of the carrier substrate 3. The IC is electrically connected from the bottom of the carrier substrate 3 by the first electrical connections 8. In particular, the bottom 33 comprises eighteen first electrical connections 8.

In the examples of FIGS. 2A to 2C, the first electrical connections 8 of the bottom of the carrier substrate 3 are electrically conductively connected with the IC 2 on the top 31 of the carrier substrate 3 by vias through the carrier substrate 3.

To complete the optoelectronic module of the example of FIGS. 2A to 2C, a radiation-emitting semiconductor component, in particular RGB LEDs, is/are arranged (not shown) on the electrical component 2, in particular on the side of the electrical component 2 remote from the carrier substrate 3. The LED chips are in particular in each case electrically conductively connected with two of the second electrical connections 5a, 5b, 6a, 6b, 7a, 7b.

FIG. 3 shows a further example of an optoelectronic module, in particular a schematic cross-section of a module.

In contrast to the example shown the FIG. 1, the electrically conductive webs 4a, 4b are of J-shaped construction. In particular, the electrically conductive webs 4a, 4b are guided towards the radiation-emitting semiconductor component 1 on the top 31 of the carrier substrate 3. The second curvature of the electrically conductive webs 4a, 4b is thus directed contrary to the second curvature of the electrically conductive webs from FIG. 1.

Furthermore, in contrast with the radiation-emitting component from FIG. 1, the radiation-emitting semiconductor component 1 comprises a recess. The recess is in particular located on the mounting side of the radiation-emitting semiconductor component 1. The electrical component 2 is preferably arranged in the recess.

Furthermore, in contrast with the example from FIG. 1, no coupling layer 9 is arranged between the radiation-emitting semiconductor component 1 and the electrical component 2. The coupling layer 9 is in particular located outside the cavity of the radiation-emitting semiconductor component 1. There may therefore in particular be a space, for example, containing air between the radiation-emitting semiconductor component 1 and the electrical component 2.

The radiation-emitting semiconductor component 1 is preferably mounted in the peripheral area, in particular outside the recess, with a coupling layer, adhesive layer 9 or a soldered joint. The radiation-emitting semiconductor component 1 is, for example, mounted in the peripheral area on the conductive structures 4a, 4b.

Figure 4:
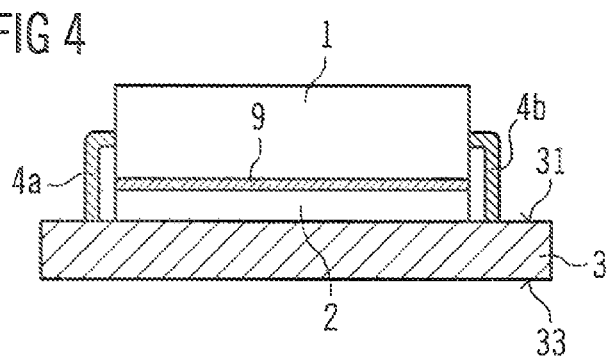

The example of FIG. 4 shows a further cross-section of an optoelectronic module. In contrast with the example shown in FIG. 1, the electrically conductive webs 4a, 4b are of an L-shape. In particular, the electrically conductive webs 4a, 4b are of L-shaped construction.

The electrically conductive webs 4a, 4b are preferably arranged on the carrier substrate 3 as an inverted L. The electrically conductive webs 4a, 4b thus comprise a curvature which leads towards the carrier substrate 3. A second curvature of the electrically conductive webs 4a, 4b is not existent in the example of FIG. 4.

The optoelectronic modules of FIGS. 3 and 4 may additionally comprise a housing in which are arranged the carrier substrate 3, the electrical component 2 and the radiation-emitting component 1 and which comprises radiation-absorbing particles (not shown). Furthermore, the optoelectronic modules of FIGS. 3 and 4 may additionally comprise an encapsulation which encloses the radiation-emitting component and likewise comprises radiation-absorbing particles (not shown).

Figure 5:
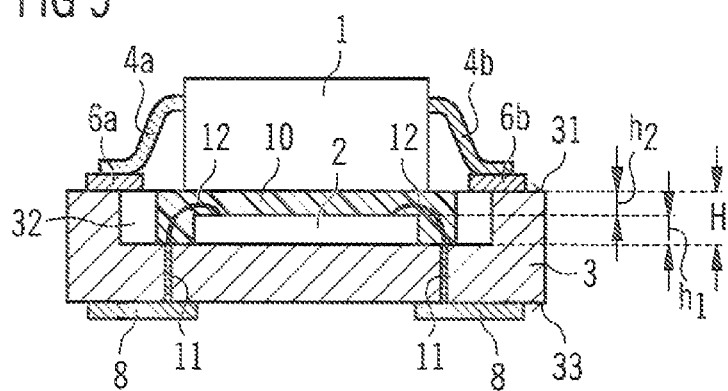

The example of FIG. 5 differs from the example of FIG. 1 in that the carrier substrate 3 comprises a cavity 32. The electrical component 2 is arranged in the cavity 32 and encapsulated by an encapsulating material 10.

The cavity of the carrier substrate 3 has a height H. The electrical component 2 has a height $h_1$ which is smaller than the height H. The electrical component 2 is thus arranged completely in the cavity 32. The encapsulating material 2 has a height $h_2$ above the electrical component 2 such that the height $h_1$ of the electrical component 2 plus the height $h_2$ of the encapsulating material 10 corresponds to the height H of the cavity. The encapsulating material 32 thus ends flush with the top 31 of the carrier substrate 3.

The radiation-emitting semiconductor component 1 is arranged on the encapsulating material 32 and electrically conductively connected with second electrical connections 6a, 6b of the carrier substrate 3 by electrically conductive webs 4a, 4b.

The electrical component 2 is electrically conductively connected by bonding wires 12 with vias 11 which lead through the carrier substrate 3. The vias 11 in particular lead to the first electrical connections 8 on the bottom 33 of the carrier substrate 3.

Figure 6:
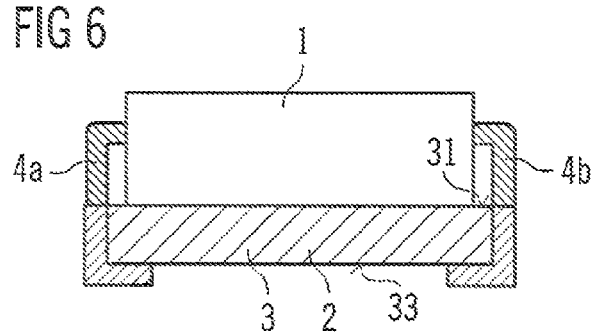

The example of FIG. 6 differs from the example of FIG. 1 in that the conductive structures 4a, 4b of the radiation-emitting semiconductor component 1 are guided against the side faces of the electrical component 2 and of the carrier substrate 3 such that they extend as far as the bottom 33 of the carrier substrate 3. Thanks to such an arrangement of the conductive structures 4a, 4b, it is in particular possible to obtain a surface-mountable module which may be externally electrically connected with the bottom of the carrier substrate 3.

Our modules and methods are not limited to the examples as a result of the description made with reference thereto, but instead encompass any novel feature and any combination of features, including in particular any combination of features in the appended claims, even if the feature or combination is not itself explicitly indicated in the claims or examples.

The invention claimed is:

1. An optoelectronic module comprising:
   a radiation-emitting semiconductor component,
   an electrical component,
   a carrier substrate comprising a top and a bottom, and
   a housing in which the carrier substrate, the electrical component and the radiation-emitting semiconductor component are arranged, wherein
   first electrical connections are arranged on the bottom and second electrical connections are arranged on the top,
   the electrical component is arranged on the top of the carrier substrate and is electrically conductively connected with the first electrical connections,
   the radiation-emitting semiconductor component is arranged on the side of the electrical component remote from the carrier substrate,
   the radiation-emitting semiconductor component comprises conductive structures electrically conductively connected with the second electrical connections,
   the housing comprises radiation-absorbing particles to improve contrast by avoiding action of extraneous sunlight,
   the radiation-emitting semiconductor component comprises a recess located on a mounting side of the radiation-emitting semiconductor component and the electrical component arranged in said recess, and
   the radiation-emitting semiconductor component is fixed to the carrier substrate with a coupling layer located only outside a cavity of the radiation-emitting semiconductor component.

2. The optoelectronic module according to claim 1, wherein the carrier substrate is a printed circuit board, the radiation-emitting semiconductor component is an LED and the electrical component is an IC for driving the LED.

3. The optoelectronic module according to claim 1, wherein the conductive structures are electrically conductive webs which project from the radiation-emitting semiconductor component.

4. The optoelectronic module according to claim 3, wherein the electrically conductive webs curve away from the radiation-emitting semiconductor component towards the carrier substrate.

5. The optoelectronic module according to claim 4, wherein the electrically conductive webs are of L-shaped construction.

6. The optoelectronic module according to claim 4, wherein the electrically conductive webs are of Z-shaped construction.

7. The optoelectronic module according to claim 4, wherein the electrically conductive webs are of J-shaped construction.

8. The optoelectronic module according to claim 3, wherein the electrically conductive webs are metal webs.

9. The optoelectronic module according to claim 1, wherein the first electrical connections are guided through the carrier substrate by vias.

10. The optoelectronic module according to claim 1, further comprising an encapsulation which encloses the radiation-emitting semiconductor component and which comprises radiation-absorbing particles.

11. The optoelectronic module according to claim 1, wherein the carrier substrate is in the form of a multilayer substrate.

12. The optoelectronic module according to claim 1, wherein
   further electrical components are arranged on the top of the carrier substrate and electrically conductively connected with further first electrical connections on the bottom of the carrier substrate, and
   further radiation-emitting components are each arranged on a side of an electrical component remote from the carrier substrate and electrically conductively connected with further second electrical connections on the top of the carrier substrate.

13. The optoelectronic module according to claim 1, wherein:
   the radiation-emitting semiconductor component is mounted on the conductive structures only in a peripheral area outside the cavity,
   a space containing air is located between the radiation-emitting semiconductor component and the electrical component, the electrical component and the radiation-emitting semiconductor component comprise a common center axis from a top view,
the top of the carrier substrate is planar, and
the radiation-emitting semiconductor component completely covers the electrical component.

* * * * *